United States Patent
Cheng et al.

(10) Patent No.: US 11,200,926 B2
(45) Date of Patent: *Dec. 14, 2021

(54) DUAL RAIL MEMORY, MEMORY MACRO AND ASSOCIATED HYBRID POWER SUPPLY METHOD

(71) Applicant: TAIWAN SEMICONDUCTOR MANUFACTURING COMPANY LTD., Hsinchu (TW)

(72) Inventors: Chiting Cheng, Taichung (TW); Yangsyu Lin, New Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/833,033

(22) Filed: Mar. 27, 2020

(65) Prior Publication Data

US 2020/0234745 A1 Jul. 23, 2020

Related U.S. Application Data

(63) Continuation of application No. 16/219,289, filed on Dec. 13, 2018, now Pat. No. 10,622,039, which is a (Continued)

(51) Int. Cl.
*G11C 7/12* (2006.01)
*G11C 8/10* (2006.01)
(Continued)

(52) U.S. Cl.
CPC .............. *G11C 7/12* (2013.01); *G11C 5/14* (2013.01); *G11C 7/06* (2013.01); *G11C 7/10* (2013.01);
(Continued)

(58) Field of Classification Search
CPC ......... G11C 7/12; G11C 11/418; G11C 29/12; G11C 2029/1802
See application file for complete search history.

(56) References Cited

U.S. PATENT DOCUMENTS 6,721,213 B2 * 4/2004 Nakayama ............... G11C 7/22
327/262
8,971,133 B1 * 3/2015 Zheng ...................... G11C 7/12
365/189.05
(Continued)

OTHER PUBLICATIONS

Office Action from the China National Intellectual Property Administration of China patent application No. 201710761821.0 dated Apr. 30, 2020.

*Primary Examiner* — Mushfique Siddique
(74) *Attorney, Agent, or Firm* — WPAT, P.C., Intellectual Property Attorneys; Anthony King

(57) ABSTRACT

A dual rail memory operable at a first voltage and a second voltage is disclosed. The dual rail memory includes: a memory array operates at the first voltage; a word line driver circuit configured to drive a word line of the memory array to the first voltage; a data path configured to transmit an input data signal or an output data signal, wherein the data path includes a first level shifter for transferring the input data signal from the second voltage to the first voltage; and a control circuit configured to provide control signals to the memory array, the word line driver circuit and the data path, wherein the control circuit includes a second level shifter for transferring an input control signal from the second voltage to the first voltage; wherein the data path and the control circuit are configured to operate at both the first and second voltages.

20 Claims, 12 Drawing Sheets

Related U.S. Application Data continuation of application No. 15/380,543, filed on Dec. 15, 2016, now Pat. No. 10,163,470, which is a continuation-in-part of application No. 14/924,069, filed on Oct. 27, 2015, now Pat. No. 9,666,253.

(60) Provisional application No. 62/220,546, filed on Sep. 18, 2015.

(51) Int. Cl.
| | | |
|---|---|---|
| *G11C 8/06* | (2006.01) | |
| *G11C 8/08* | (2006.01) | |
| *G11C 5/14* | (2006.01) | |
| *G11C 7/10* | (2006.01) | |
| *G11C 7/06* | (2006.01) | |
| *G11C 7/22* | (2006.01) | |
| *G11C 29/12* | (2006.01) | |
| *G11C 11/413* | (2006.01) | |
| *G11C 11/418* | (2006.01) | |
| *G11C 29/18* | (2006.01) | |

(52) U.S. Cl.
CPC ............. *G11C 7/22* (2013.01); *G11C 8/06* (2013.01); *G11C 8/08* (2013.01); *G11C 8/10* (2013.01); *G11C 11/413* (2013.01); *G11C 11/418* (2013.01); *G11C 29/12* (2013.01); *G11C 29/18* (2013.01); *G11C 2029/1802* (2013.01)

(56) References Cited

U.S. PATENT DOCUMENTS

| | | | |
|---|---|---|---|
| 2002/0012272 A1 | 1/2002 | Shukuri et al. | |
| 2011/0188326 A1* | 8/2011 | Lee | G11C 7/00 365/189.11 |
| 2013/0135946 A1 | 5/2013 | Katoch | |
| 2014/0025981 A1 | 1/2014 | Evans et al. | |
| 2014/0211576 A1* | 7/2014 | Bartling | G11C 29/36 365/189.16 |
| 2014/0247081 A1* | 9/2014 | Yeung | H03K 19/0185 327/333 |
| 2015/0098267 A1* | 4/2015 | Jain | G11C 11/419 365/154 |

* cited by examiner

DUAL RAIL MEMORY, MEMORY MACRO AND ASSOCIATED HYBRID POWER SUPPLY METHOD

CROSS REFERENCE TO RELATED APPLICATIONS

This application claims is a continuation application of application Ser. No. 16/219,789, filed on Dec. 13, 2018, which is a continuation application of application Ser. No. 15/380,543, filed on Dec. 15, 2016, which is a continuation-in-part application of application Ser. No. 14/924,069, filed on Oct. 27, 2015, which claims priority to U.S. provisional application Ser. No. 62/220,546, filed on Sep. 18, 2015. All of the above-referenced applications are hereby incorporated herein by reference in their entirety.

BACKGROUND

Memory devices are subject to a phenomenon known as leakage power. Leakage power is typically dissipated by logic in the periphery and core memory arrays whenever the memory is powered on. As technology continues to shrink device features below sub-nanometer geometries, leakage power dissipation in a memory device increases. This leakage power is becoming a significant factor of the total power dissipation in memory.

One way to reduce leakage power is to reduce the power supply voltage for a memory device. However, the voltage level of a bit cell in the memory needs to be maintained at a minimum voltage specification for retention, while periphery sections of the memory device can operate below the specified voltage. As a result, dual rail memory power supplies have been developed where the periphery and core of a memory operate with different power supplies at different voltages, in an effort to reduce leakage power. Memories with dual rail memory power supplies use level shifters to isolate a high-voltage domain (e.g., VDDM) for one group of circuits from a low-voltage domain (e.g., VDD) for another group of circuits and convert signal voltages by the level shifters to an appropriate domain.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
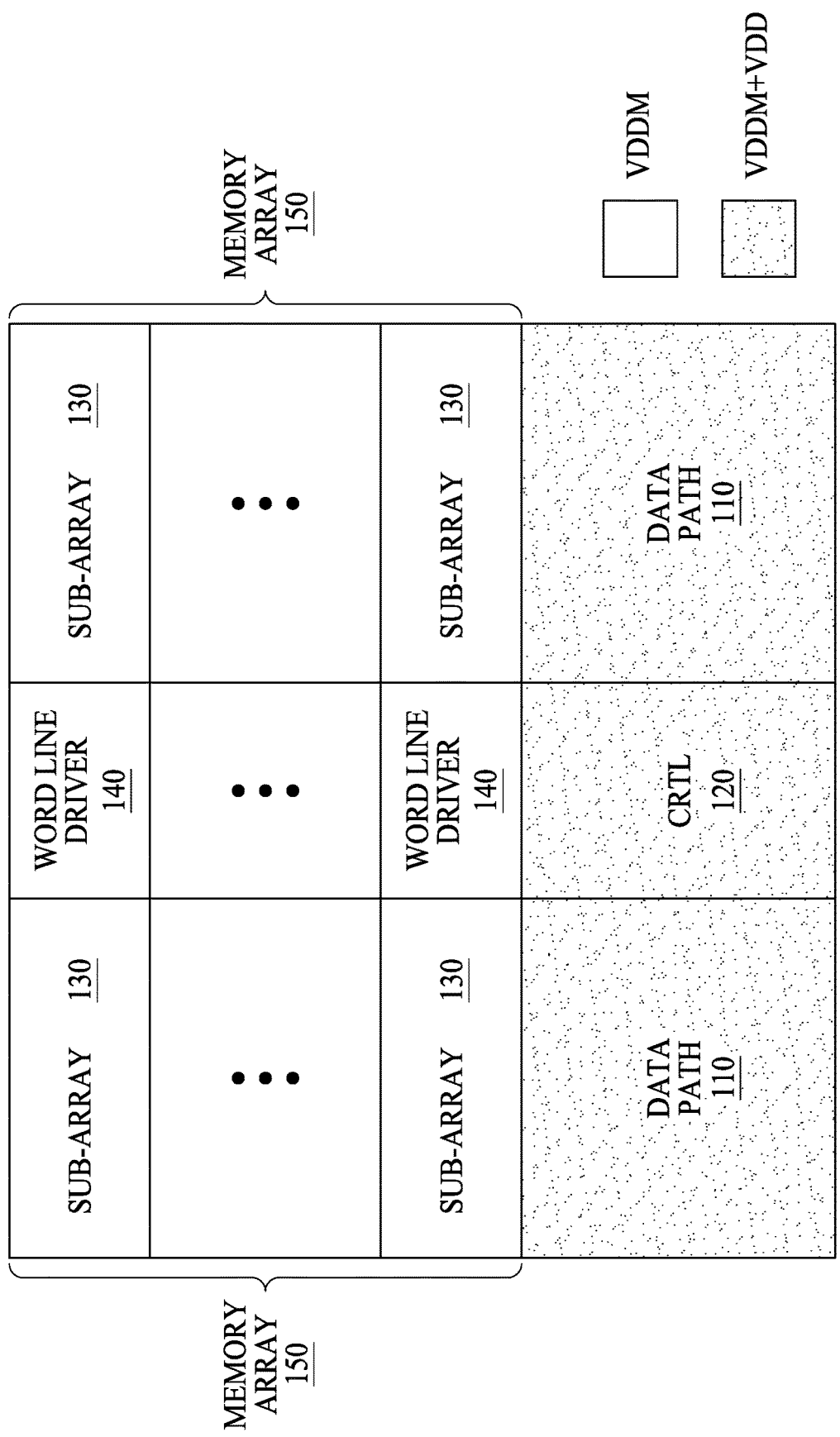
FIG. 1 is a block diagram conceptually illustrating a hybrid dual rail memory power supply scheme for a memory macro according to an exemplary embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Embodiments of the present invention will be described herein in the context of an exemplary hybrid dual rail memory power supply scheme for a memory. It is to be appreciated, however, that the invention is not limited to the specific circuits and systems illustratively shown and described herein. Rather, embodiments of the invention are directed broadly to techniques for beneficially integrating features of a hybrid dual rail memory power supply scheme in high-density memory, without regard for whether the memory is embedded or standalone. In this manner, embodiments of the invention provide a hybrid dual rail memory power supply scheme that can be beneficially used in a variety of memory arrangements and types, such as, for example, random access memory (RAM), static random access memory (SRAM), read-only memory (ROM), content addressable memory (CAM), flash memory, register files, and the like. Moreover, it will become apparent to those skilled in the art given the teachings herein that numerous modifications can be made to the embodiments shown that are within the scope of the present invention. That is, no limitations with respect to the specific embodiments described herein are intended or should be inferred.

FIG. 1 is a block diagram conceptually illustrating a hybrid dual rail memory power supply scheme for a memory macro 100 according to an exemplary embodiment of the present disclosure. The memory macro 100 may be a static random access memory (SRAM), and may be situated in a computer or other electronic systems. Referring to FIG. 1, the memory macro 100 includes a plurality of memory arrays 150, typically two dimensional, of memory bit cells configured to store respective logic states, i.e., either a logic high (logical "1") or a logic low (logical "0"). The memory bit cells are often arranged in one or more parallel columns 130 (each a one dimensional sub-array 130).

In the exemplary embodiment, the memory macro 100 has a symmetrical structure. For example, the left side of the memory macro 100 has similar elements as the right side of the memory macro 100. The plurality of memory sub-arrays 130 as disposed in both of the left side and right side of the memory macro 100 are shown in FIG. 1. Two data paths 110 are also deployed in a symmetrical manner, one on the left side and one on the right side.

The data paths 110 include circuitry to transfer data between corresponding memory sub-arrays 130 and circuits outside of the memory macro 100. For example, in some embodiments, the data paths 110 include circuits to perform write mask operations, circuits to control column redundancy, circuits to encode and decode the error correction code (ECC), sense amplifier circuits for global bit lines, write driver circuits for global bit lines, etc. However, this is not a limitation of the present disclosure.

Word line driver circuits 140 located between the two symmetrical memory arrays 150 are utilized for driving a word line of the memory arrays 150 to a word line driving voltage of a specified voltage level. The control circuit 120 provides control signals for the plurality of sub-arrays 130 and the data paths 110 of the left and right side memory arrays 150. In some embodiments, the control circuit 120 generates control and timing signals for sense amplifiers used in sensing bit cells in the memory array 150. The control circuit 120 also includes circuits to select banks of memory cells, circuits to decode the word line and word line drivers, etc.

In this embodiment, a first power supply is employed having a first voltage, VDDM, and a second power supply is employed having a second voltage, VDD, that is lower than the first voltage VDDM. A power domain assignation of the first voltage VDDM and second voltage VDD are illustrated in FIG. 1. The memory macro 100 is structured so that the memory arrays 150 and the word line driver circuits 140 substantially operate at the first voltage VDDM, while the data paths 110 and the control circuit 120 are configured to operate at both the first voltage VDDM and the second voltage VDD. Specifically, a portion of the data paths 110 and a portion of the control circuit 120 are configured to operate at the first voltage VDDM; and a remaining portion of the data paths 110 and a remaining portion of the control circuit 120 are configured to operate at the lower second voltage VDD.

The hybrid dual rail memory power supply scheme of FIG. 1 has advantages in that a balanced performance on both speed and power consumption can be achieved, especially compared with existing interface level shifter dual rail memory and true dual rail memory power supply schemes. A dual rail memory macro is called the interface level shifter dual rail memory when the entire memory macro operates in a first voltage domain of a higher power supply than a second voltage domain outside the memory macro, wherein level shifters are disposed at a pin boundary of the memory macro. For a true dual rail memory power supply scheme, only memory arrays and a portion of word line driver of the memory macro operate at a first voltage, and the remaining circuits of the memory macro operate in another domain at a second voltage lower than the first voltage.

For simplicity, various circuits in each of the data paths 110, the control circuit 120, the memory array 150 and the word line driver circuits 140 are not shown in the block diagram. Details regarding the various circuits are provided in the following drawings and descriptions are in the following paragraphs. It will become apparent to those skilled in the art given the teachings herein that numerous modifications can be made to the embodiments shown that are within the scope of the present invention.

Figure 2:
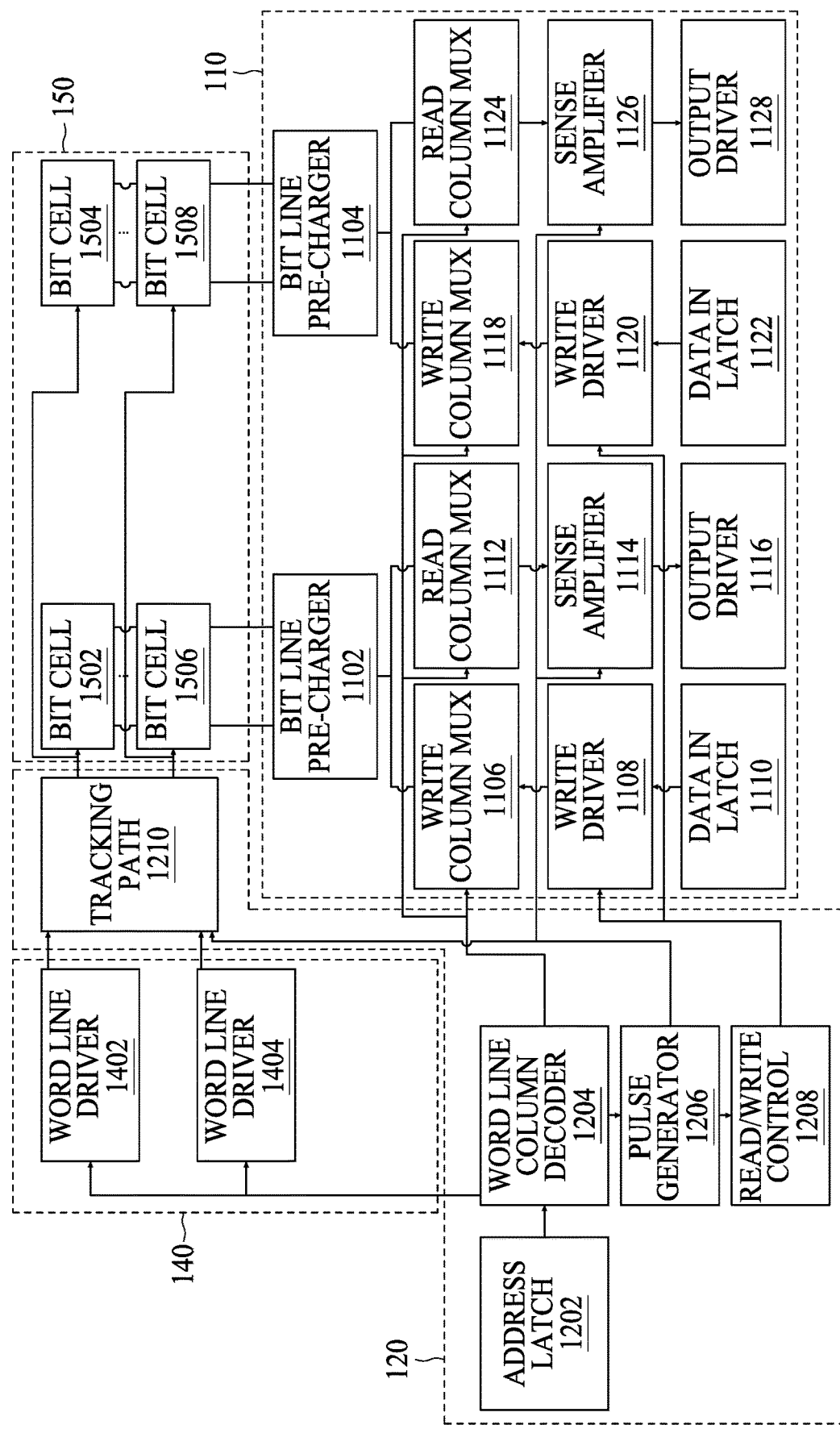
FIG. 2 is a more detailed schematic diagram illustrating the memory macro of FIG. 1 according to an exemplary embodiment of the present disclosure.

FIG. 2 is a more detailed schematic diagram illustrating the memory macro 100 of FIG. 1 according to an exemplary embodiment of the present disclosure. With respect to the FIG. 1, like elements in FIG. 2 are designated with the same reference numbers for ease of understanding. At the upper right side of FIG. 2, the memory array 150 includes a plurality of bit cells 1502-1508, which are depicted for illustrative purpose only. As mentioned above, the entire memory array 150 operates at the first voltage VDDM higher than the second voltage VDD in order to reduce occurrence of errors during read/write operations. In addition, the reduction in power supply voltage of the memory array 150 can cause the memory array 150 more susceptible to soft error rate effects. Soft error rate is a measure of the ability of each bit cell to maintain a data state in the presence of environmental noise such as alpha (α) particles. Alpha particles are a form of radiation energy commonly found in the environment. Alpha particles are very high energy particles that are very capable of penetrating many objects in the environment.

At the lower left side of FIG. 2, the control circuit 120 comprises an address latch 1202, a word line column decoder 1204, a pulse generator 1206, a read/write control 1208 and a tracking path 1210. The control inputs of the control circuit 120 may include, for example, addresses, read/write enable and chip select enable. The address latch 1202, the word line column decoder 1204, the read/write control 1208 and the pulse generator 1206 operate at the first voltage VDDM. The tracking path 1210 operates at both the first voltage VDDM and the second voltage VDD. Input level shifters (not shown in FIG. 2) are located in front of the address latch 1202 latching the control inputs, and transfer the control inputs from a peripheral voltage (e.g. the second voltage VDD) external to the memory macro 100 to the first voltage VDDM. As such, access time of the memory array 150 is not affected. By comparison, in the existing interface level shifter dual rail memory power supply scheme, word line level shifters are located after address latches, memory access time is adversely affected due to level shifter delay.

The word line column decoder 1204 serves as an interface for a particular column of the memory array 150. The pulse generator 1206 generates a pulse having a pulse width. The width of the pulse is selected so that the voltage level of a specified bit cell in the memory array 150 is reduced for a period of time that is sufficient for the data value to be written to that bit cell, while still being short enough to avoid other bit cells in the column becoming unstable.

Figure 3:
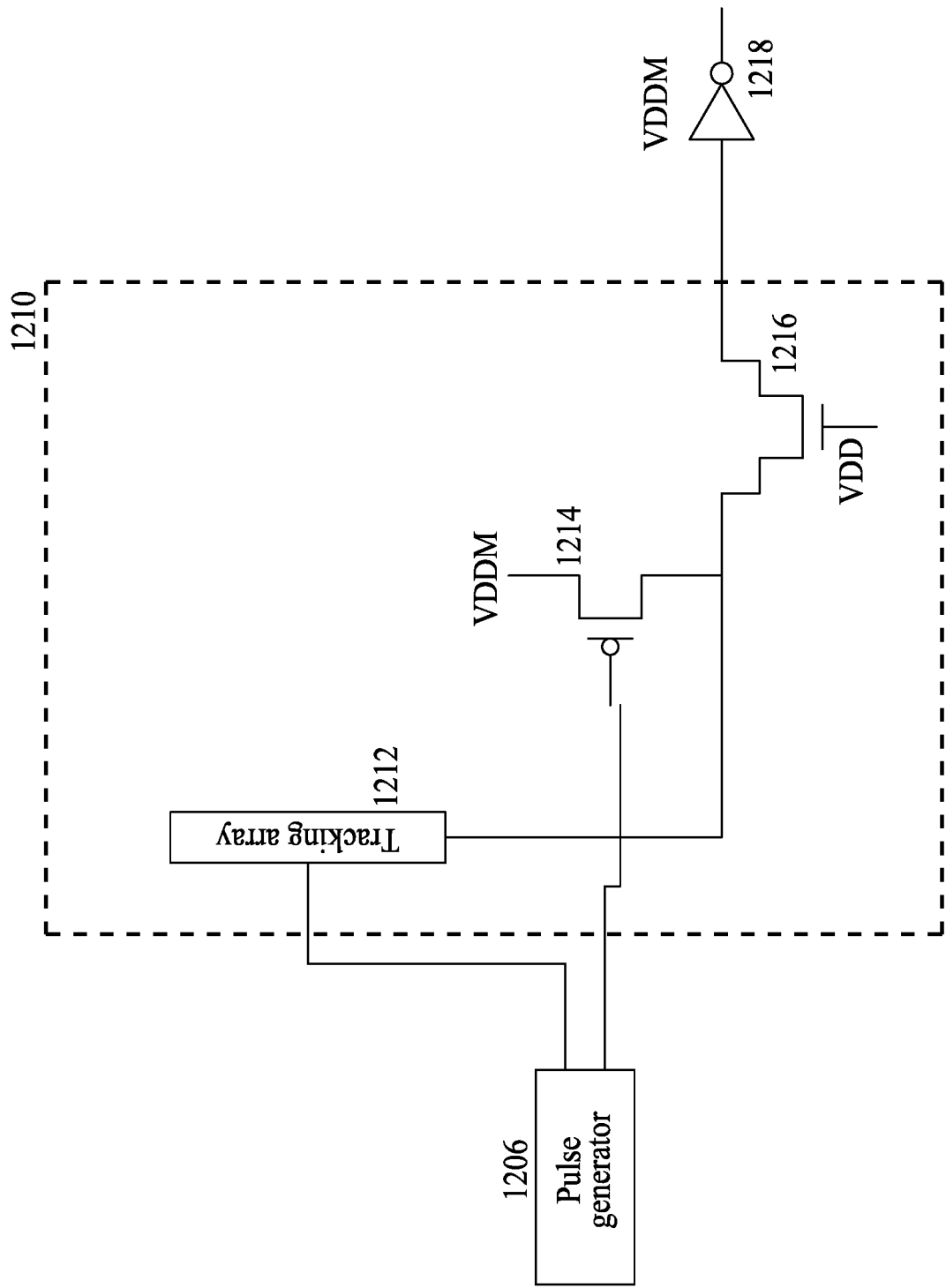
FIG. 3 is a schematic diagram illustrating a portion of a control circuit according to an exemplary embodiment of the present disclosure.

FIG. 3 is a schematic diagram illustrating a portion of the control circuit 120 according to an exemplary embodiment of the present disclosure. As shown in FIG. 3, the tracking path 1210 includes a tracking array 1212, a p-channel metal-oxide-semiconductor field-effect transistor (hereinafter called "PMOS" device) 1214 and an NMOS device 1216. By using an inverter 1218 that operates at the first voltage VDDM, an inverted output of the tracking path 1210 is coupled to the bit cells of the memory array 150 so as to allow a voltage level of the specified bit cell being reduced in response to an output width of the pulse generator 1206. As such, like the memory array 150, the pulse generator 1206, the tracking array 1212 and the PMOS device 1214 are configured to operate at the first voltage VDDM. The NMOS 1216 is used as a transmission gate coupled between the tracking array 1212 and the bit cells in the memory array 150. A gate of the NMOS 1216 is coupled to the second voltage VDD. Although the second voltage VDD is lower than the first voltage VDDM, the NMOS still can be turned on to allow signals to pass through.

Referring back to FIG. 2, at the upper left side, the word line driver circuits 140 include two word line drivers 1402 and 1404. At the lower right side of FIG. 2, the data paths 110 include a pair of data paths. The left data path includes a bit line pre-charger 1102 coupled to a write data path and a read data path. The write data path of the left data path includes a write column mux 1106, a write driver 1108 and a data in latch 1110. The read data path of the left data path includes a read column mux 1112, a sense amplifier 1114 and an output driver 1116. Similarly, the right data path includes a bit line pre-charger 1104 coupled to a write data path and a read data path. The write data path of the right data path includes a write column mux 1118, a write driver 1120 and a data in latch 1122. The read data path of the right data path includes a read column mux 1124, a sense amplifier 1126 and an output driver 1128.

The write driver 1108 is utilized to drive input data latched by the data in latch 1110 received from a CPU or another processor during a write operation, wherein the input data may be complimentary data. The input data requires to be written into a specified bit cell of the memory array 150 that is identified by the control circuit 120. Output signals of the write driver 1108 selectively pass through the corresponding write column mux 1106 in response to the decoding result of the word line column decoder 1204 of the control circuit 120. The output signals of the write driver 1108 are pre-charged via the bit line pre-charger 1102.

Figure 4:
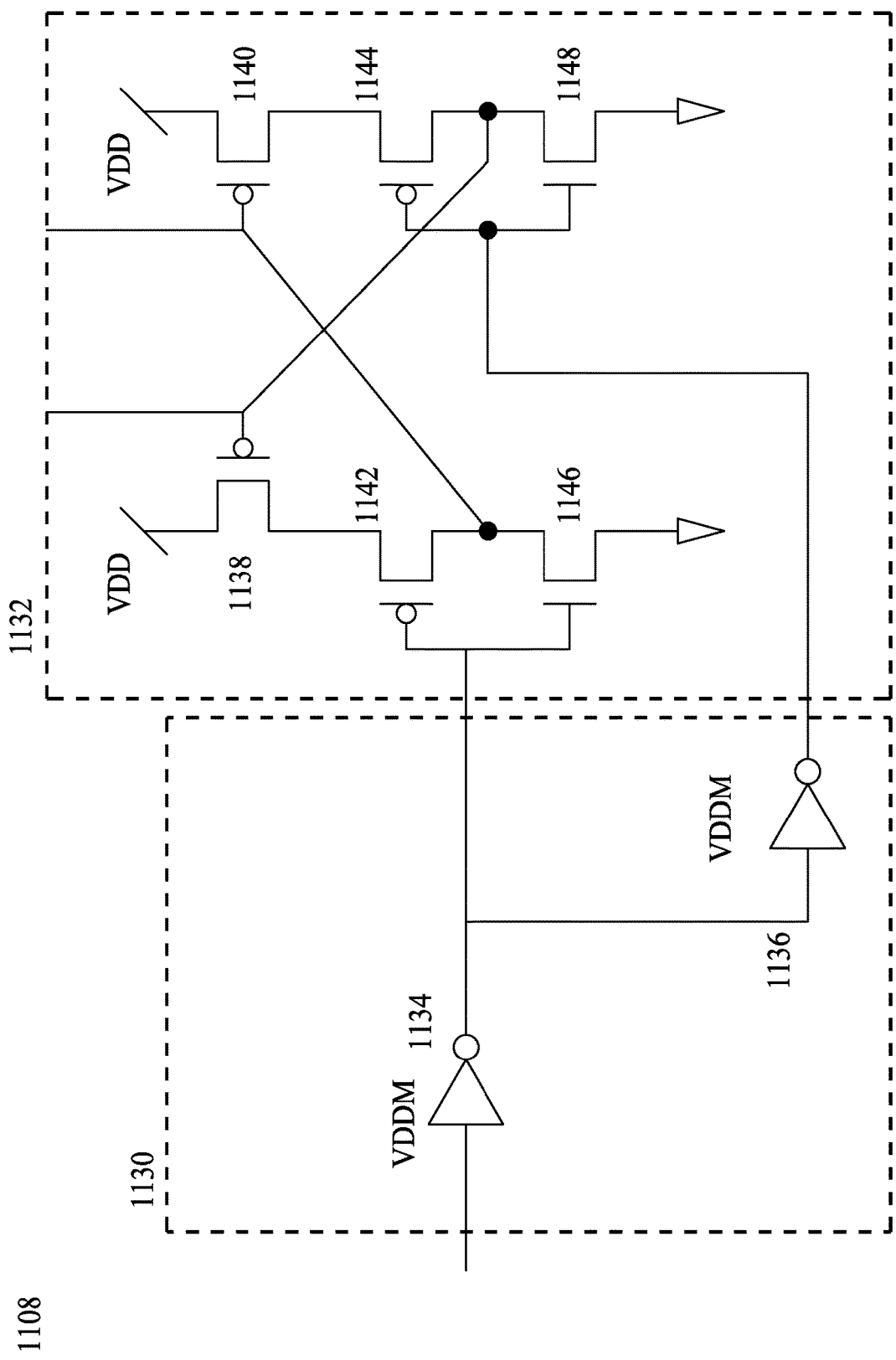
FIG. 4 is a schematic diagram illustrating a write driver according to an embodiment of the present disclosure.

The bit line pre-charger 1102 and the data in latch 1110 are configured to operate at the second voltage VDD, while the write driver 1108 is configured to operate at both the first voltage VDDM and the second voltage VIII). Please refer to FIG. 4. FIG. 4 is a schematic diagram illustrating the write driver 1108 according to an embodiment of the present disclosure. The write driver 1108 includes a write driver pre-stage 1130 and a write driver post-stage 1132. The write driver pre-stage 1130 includes inverters 1134 and 1136 both being configured to operate at the first voltage VDDM. The write driver pre-stage 1130 receives write data from the data in latch 1110 via a level shifter (not shown in FIG. 4). Since the data in latch 1110 and the write driver pre-stage 1130 operate in different voltage domains, the level shifter transfers the write data from the second voltage VDU domain to the first voltage VDDM domain.

The write driver post-stage 1132 includes cross-coupled PMOS devices 1138-1144 and NMOS devices 1146 and 1148. According to the hybrid dual rail memory power supply scheme, the write driver post-stage 1132 is configured to operate at the second voltage VDD to eliminate any DC current being introduced in.

Referring back to FIG. 2, the read data path of the left data path includes a read column mux 1112, a sense amplifier 1114 and an output driver 1116. During a read operation, a voltage difference develops across corresponding bit lines and is passed to the sense amplifier 1114 through the corresponding read column mux 1112. When a sufficient voltage differential is attained, the sense amplifier 1114 is turned on. The read column mux 1112, the sense amplifier 1114 and the output driver 1116 are configured to operate at the second voltage VDD, so that lever shifters can be omitted at an interface of the read data path. The right data path of the data path 110 is substantially the same as the left data path, and the details are omitted here for brevity.

Figure 5:
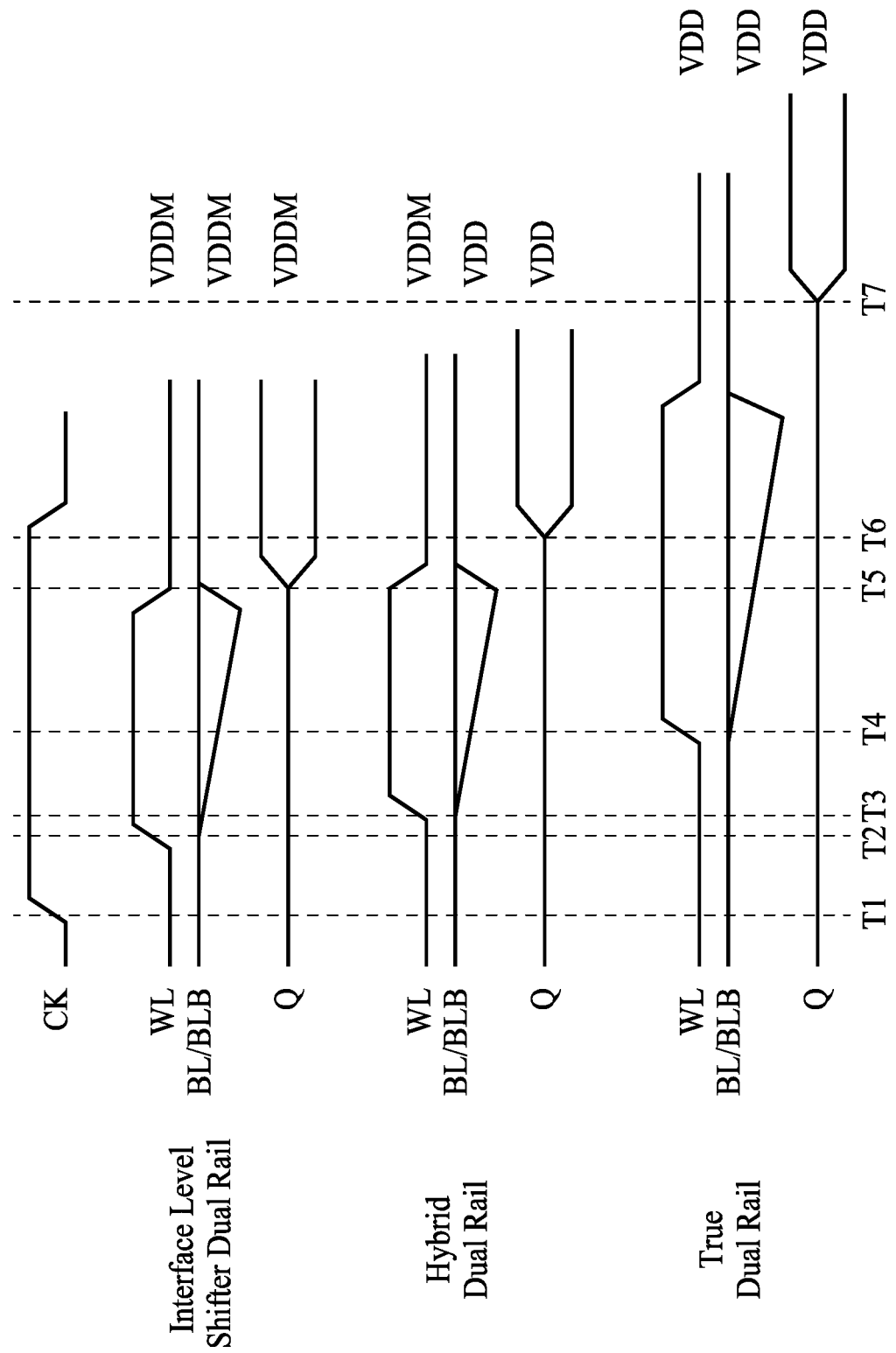
FIG. 5 is a timing diagram illustrating wave forms of the hybrid dual rail memory power supply scheme and existing dual rail memory power supply schemes during a read operation.

FIG. 5 is a timing diagram illustrating wave forms of the hybrid dual rail memory power supply scheme and existing dual rail memory power supply schemes during a read operation. As shown in FIG. 5, signals during a read operation with respect to three different schemes, i.e. the hybrid dual rail memory power supply scheme of the present disclosure, the interface level shifter dual rail memory power supply scheme and the true dual rail memory power supply scheme, are illustrated to facilitate comparison of timing sequences. A top most clock signal CK is used as a reference timing index for the three different power supply schemes. Each power supply scheme has a word line signal WL, a bit line signal BL and its complementary signal BLB, and a signal Q sensed by a sense amplifier.

As mentioned above, the memory macro employing the interface level shifter dual rail memory power supply scheme purely has a control circuit and read data paths operating in a voltage domain (e.g. the first voltage VDDM)

the same as the memory arrays voltage domain; while the memory macro employing the true dual rail memory power supply scheme has a control circuit and a read data path operating in a lower voltage domain (e.g. the second voltage VDU) than the voltage domain (e.g. the first voltage VDDM) that the memory array operates in. As for the hybrid dual rail memory power supply scheme of the present disclosure, the control circuit 120 operates at both the first voltage VDDM and the second voltage VDD, and the read data path operates at the second voltage VDD.

As can be seen from FIG. 5, the interface level shifter dual rail memory power supply scheme has a fastest rising timing of the word line signal WL at time T2 after the assertion of the clock signal CK at time T1. The timing of rising of the word line signal WL of the hybrid dual rail memory power supply scheme at time T3 is slightly behind the interface level shifter dual rail memory power supply scheme due to the fact that the control circuit partially operates at the second voltage VDD which more or less affects the rising speed of the word line signal WL. The word line signals WL of the interface level shifter dual rail memory power supply scheme and the hybrid dual rail memory power supply scheme are both pulled up to the first voltage VDDM by the word line driver which operates at the first voltage VDDM; while in the true dual rail memory power supply scheme, the word line signals WL rises until attaining the second voltage VDD because the word line driver is configured to operate at the second voltage VDD. As a consequence, the timing of rising of the word line signal WL of the true dual rail memory power supply scheme at time 14 is much behind the interface level shifter dual rail memory power supply scheme and the hybrid dual rail memory power supply scheme as shown in the timing diagram. A width of the word line signal WL is also much longer than that of the other two power supply schemes in order to reserve a longer time for discharging the bit line BL or its complementary signal BLB.

For the interface level shifter dual rail memory power supply scheme; the bit lines BL and its complementary signal BLB are previously pre-charged to the first voltage VDDM; while in the hybrid dual rail memory power supply scheme and the true dual rail memory power supply scheme, the bit lines BL and its complementary signal BLB are previously pre-charged to the second voltage VDD. When the word line WL rises after the read operation begins, one of the bit line BL and its complementary signal BLB is discharged slightly and as can be seen in the timing diagram, the voltages on the bit lines BL and its complementary signal BLB begin to spread apart. A differential bit line voltage is developed between the bit line BL and its complementary signal BLB; this differential voltage may then be sensed and amplified by a sense amplifier coupled to the pair of bit lines as mentioned in the previous paragraphs, and a read data from the sense amplifier is then output from the memory array.

In the interface level shifter dual rail memory power supply scheme, the differential bit line voltage is successfully sensed by the sense amplifier at time T5. The sensing of the hybrid dual rail memory power supply scheme is completed at time T6 and slightly behind the interface level shifter dual rail memory power supply scheme; while the sensing of the true dual rail memory power supply scheme is completed at time T7, which is much slower than the sensing speed of the interface level shifter dual rail memory power supply scheme and the hybrid dual rail memory power supply scheme. As can be seen from the timing diagram, the sensing speed of the hybrid dual rail memory power supply scheme is approximately between the sensing speed of the interface level shifter dual rail memory power supply scheme and the true dual rail memory power supply scheme. Specifically, the sensing speed performance of the hybrid dual rail memory power supply scheme is relatively closer to the interface level shifter dual rail memory power supply scheme.

Figure 6:
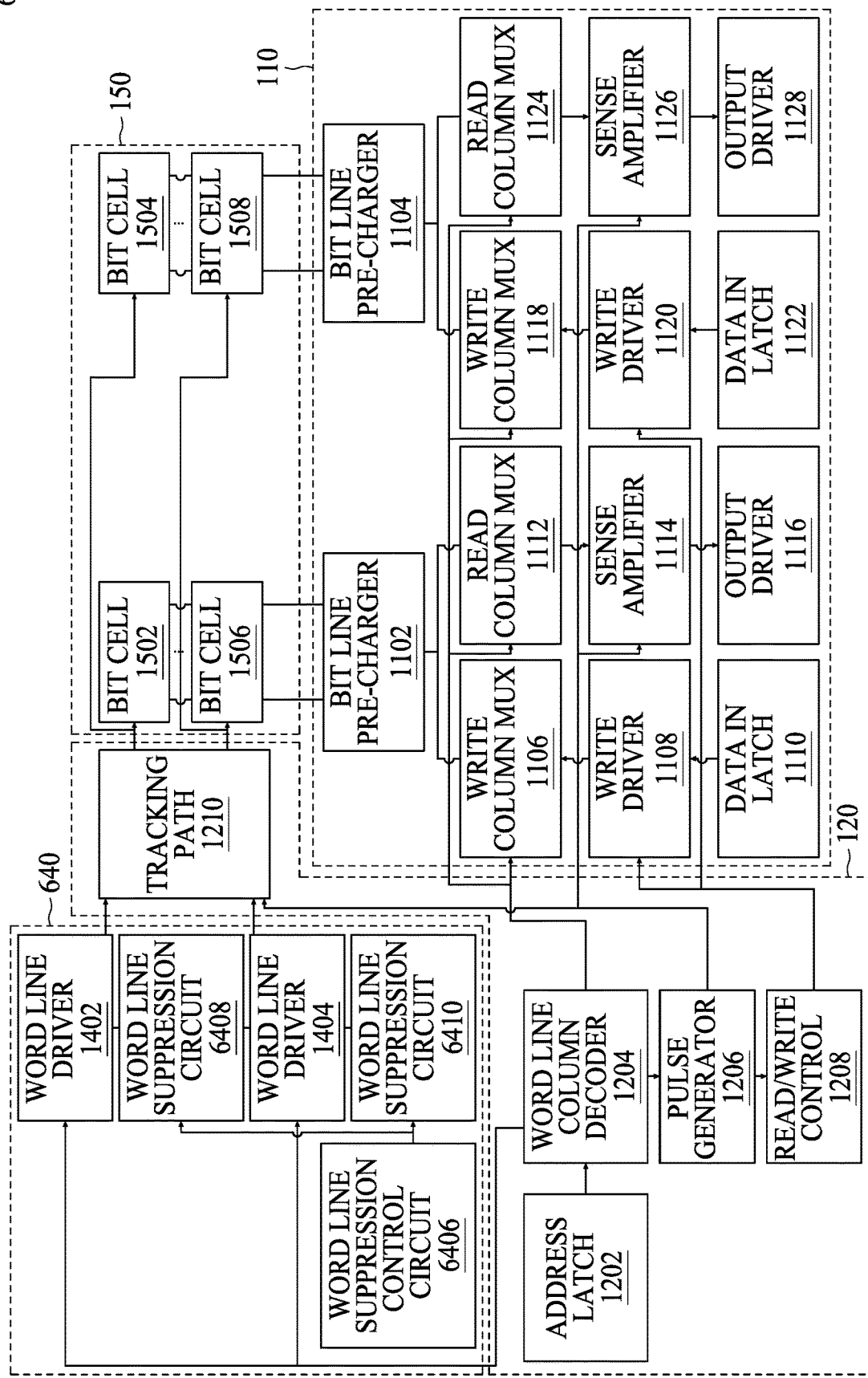
FIG. 6 is a block diagram conceptually illustrating a hybrid dual rail memory power supply scheme with a suppressed word line voltage for a memory macro according to an exemplary embodiment of the present disclosure.

When the peripheral voltage (i.e. the second voltage VDD) keeps cutting down, the gap between the memory array voltage (i.e. the first voltage VDDM) and the peripheral voltage is widening. Such a gap may lead to incorrect functionality during a read operation, such as read/write disturbance. In view of the issue, various assistance mechanisms have been developed, seeking to assist individual memory cells in operating correctly when write and read operations are performed on those cells. In some embodiments, techniques for implementing a suppressed word line voltage may be included in the memory macro 100. FIG. 6 is a block diagram conceptually illustrating a hybrid dual rail memory power supply scheme with a suppressed word line voltage for a memory macro 600 according to an exemplary embodiment of the present disclosure. The memory macro 600 is the same as the memory macro 100 except a word line driver circuit 640. In the word line driver circuit 640, a word line suppression control circuit 6406, a word line suppression circuit 6408 and word line suppression circuit 6410 are used to adjust a word line voltage driven by the word line drivers 1402 and 1404 from the first voltage VDDM to a suppressed voltage level which is lower than the first voltage VDDM. In some embodiments, the suppressed voltage is lower than the first voltage VDDM and higher than the second voltage VDD.

Figure 7:
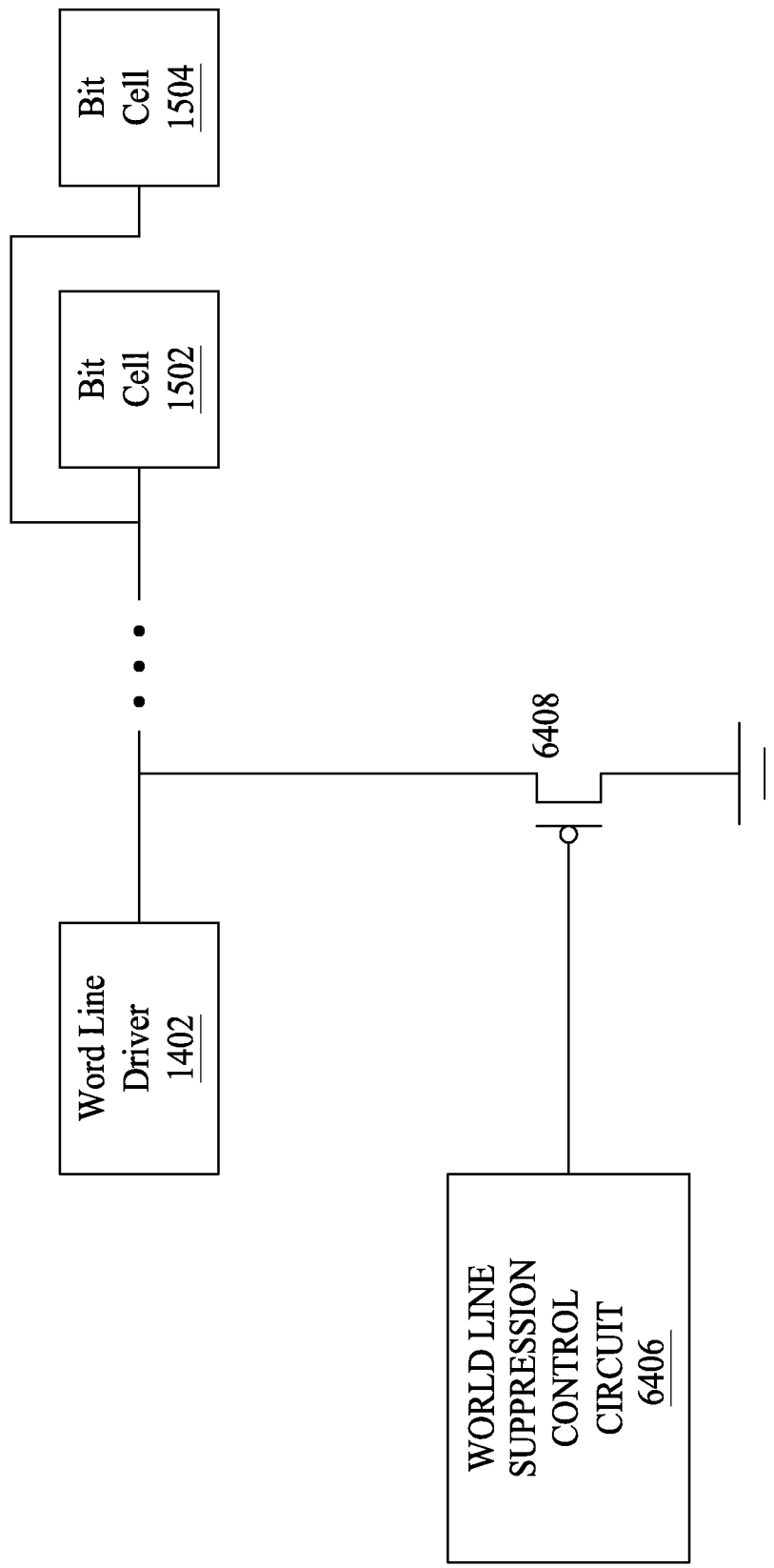
FIG. 7 is a schematic diagram illustrating the word line suppression circuit according to an embodiment of the present disclosure.
Figure 8:
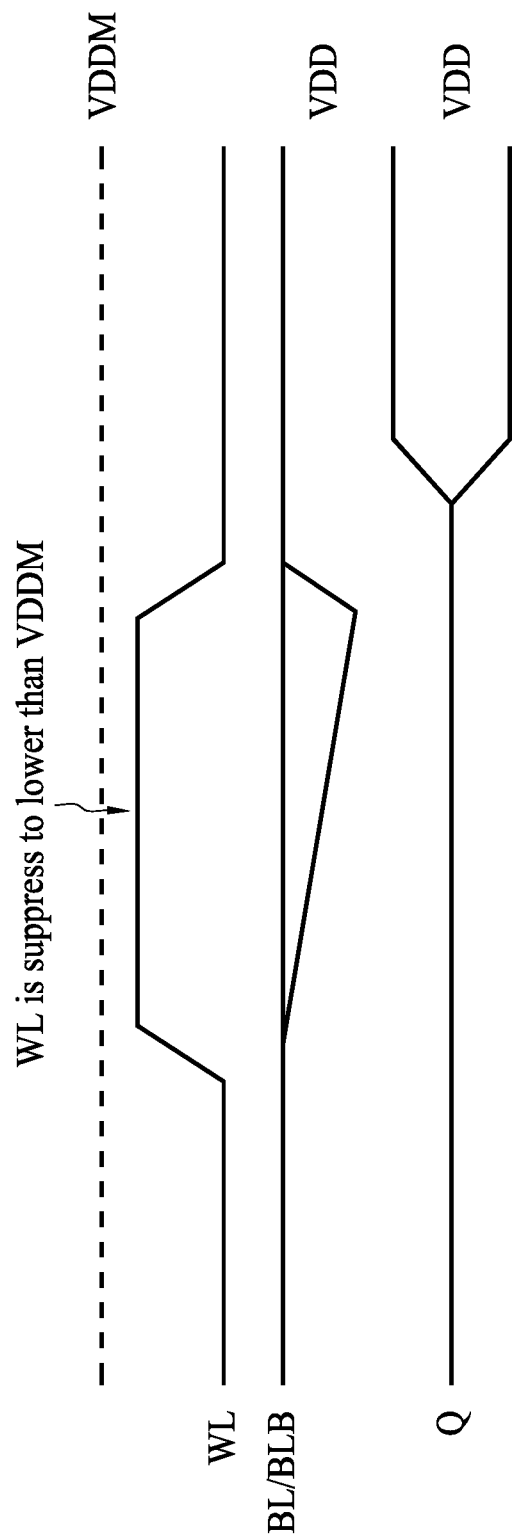
FIG. 8 is a timing diagram illustrating wave forms of the hybrid dual rail memory power supply scheme with a suppressed word line voltage during a read operation.

FIG. 7 is a schematic diagram illustrating the word line suppression circuit according to an embodiment of the present disclosure. As can be seen in FIG. 7, the word line suppression circuits 6408 is a PMOS device having a gate terminal coupled to the word line suppression control circuit 6406 and a source terminal coupled to the word line. In some embodiments, the word line suppression circuits 6408 may be implemented by an NMOS device. FIG. 8 is a timing diagram illustrating wave forms of the hybrid dual rail memory power supply scheme with a suppressed word line voltage during a read operation.

Figure 9:
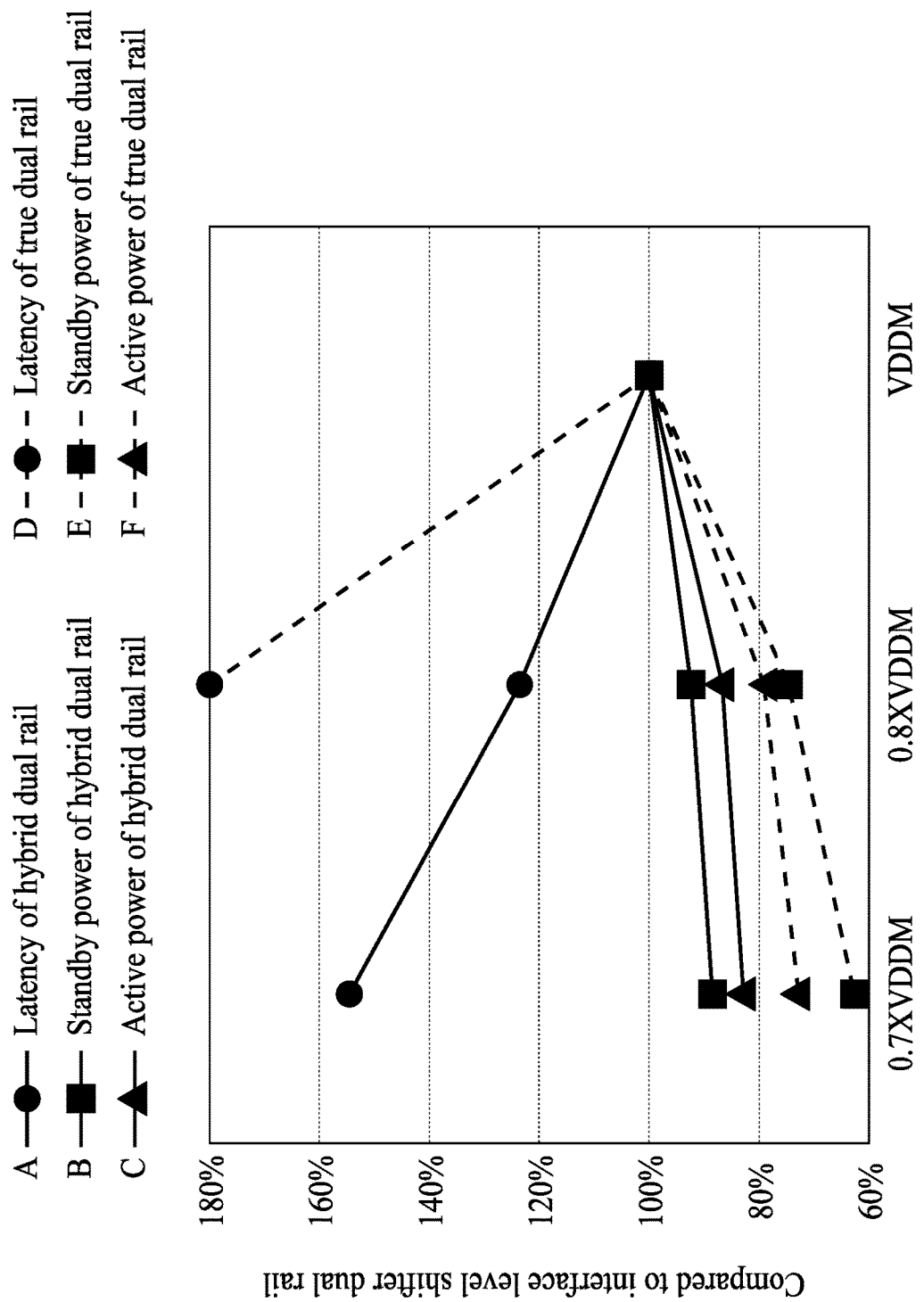
FIG. 9 is a diagram illustrating measured curves of the hybrid power supply scheme and existing power supply schemes with respect to performance of speed and power consumption by different configurations of the second voltage.

FIG. 9 is a diagram illustrating measured curves of the hybrid power supply scheme and existing power supply schemes with respect to performance of speed and power consumption by different configurations of the second voltage VDD. Referring to FIG. 9, the x-axis represents a quantized comparison result with the interface level shifter dual rail memory scheme; and the y-axis represents the second voltage VDD. An upper curve D of FIG. 9 relates to a read latency of the true dual rail memory power supply scheme. As can be seen in the diagram, when the second voltage VDD equals to the first voltage VDDM, a read latency of the true dual rail memory power supply scheme is substantially the same as the interface level shifter dual rail memory power supply scheme. However, when the second voltage VDD reaches 0.8 VDDM, a read latency of the true dual rail memory power supply scheme is increased to about 180% of a read latency of the interface level shifter dual rail memory power supply scheme.

Please note that it should be apparent to the person of ordinary skill in the art that variations may exist in the first voltage VDDM and/or the second voltage VDD due to some non-ideal factors such as the IR drop, the thermal effect, or process variations. Practically, each of the first voltage VDDM and the second voltage VDD may be a substantial voltage value having a variation range, for example, ±10%. However, this is not a limitation of the present disclosure.

Below the upper curve D, from top to bottom, the curve A of FIG. 9 relates to a read latency of the hybrid dual rail memory power supply scheme; curve B relates to a standby power of the hybrid dual rail memory power supply scheme; curve C relates to an active power of the hybrid dual rail memory power supply scheme; curve F relates to an active power of the true dual rail memory power supply scheme; and curve E relates to a standby power of the true dual rail memory power supply scheme. As can be seen from the measured curves, the hybrid dual rail memory power supply scheme has a better performance in terms of speed and power consumption as compared to the true dual rail memory power supply scheme.

In some embodiments, the hybrid dual rail memory power supply scheme that can be beneficially applied to a variety of memory arrangements and types, such as a single-port SRAM, a two-port SRAM, a dual-port SRAM and a multi-port SRAM. The bit cells in the memory array of the memory macro may be 8-T (8 transistors) bit cells. However, it will become apparent to those skilled in the art given the teachings herein that numerous modifications can be made to the embodiments shown that are within the scope of the present invention.

Figure 10:
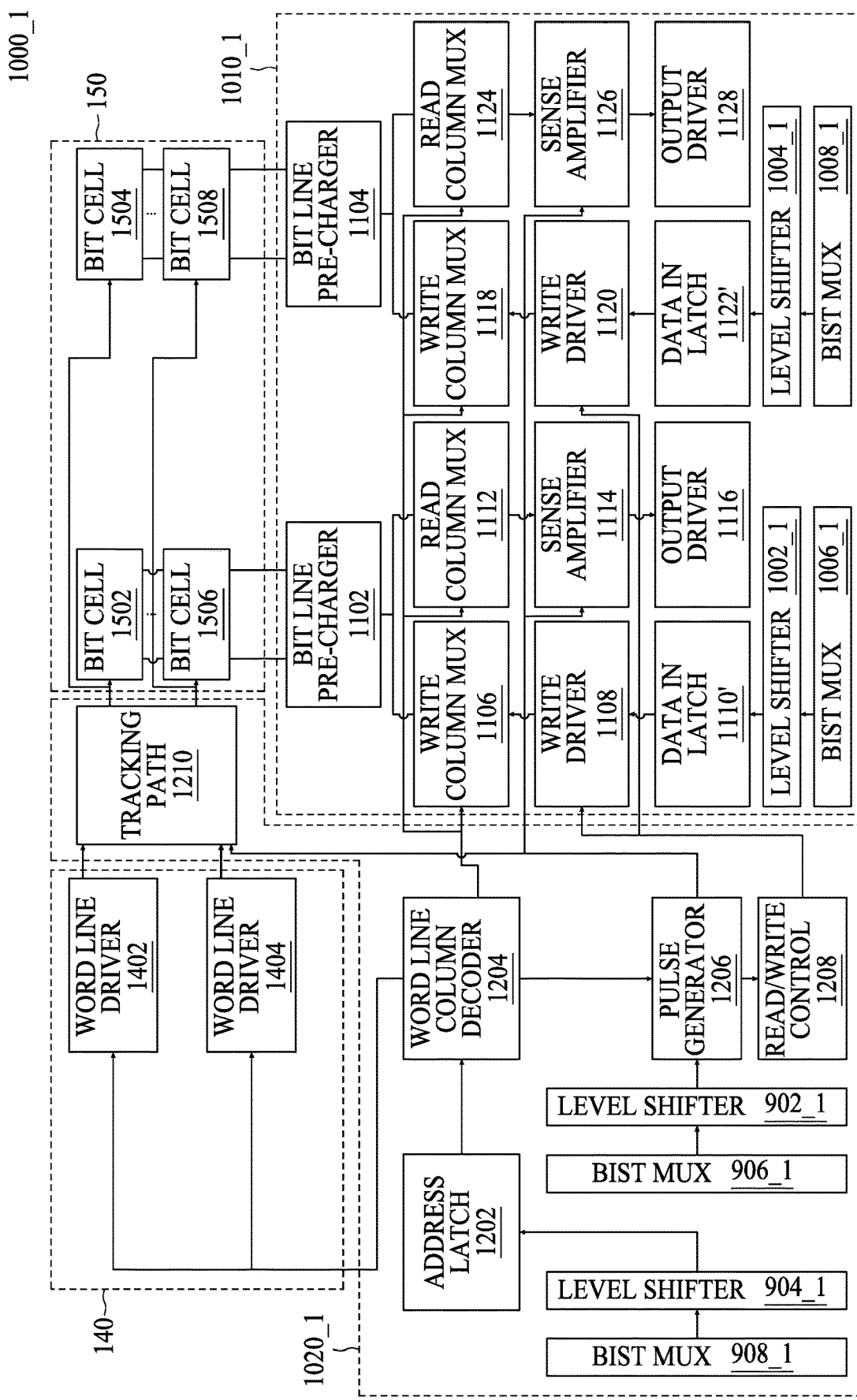
FIG. 10 is a more detailed schematic diagram illustrating a memory macro according to an embodiment of the present disclosure.
Figure 11:
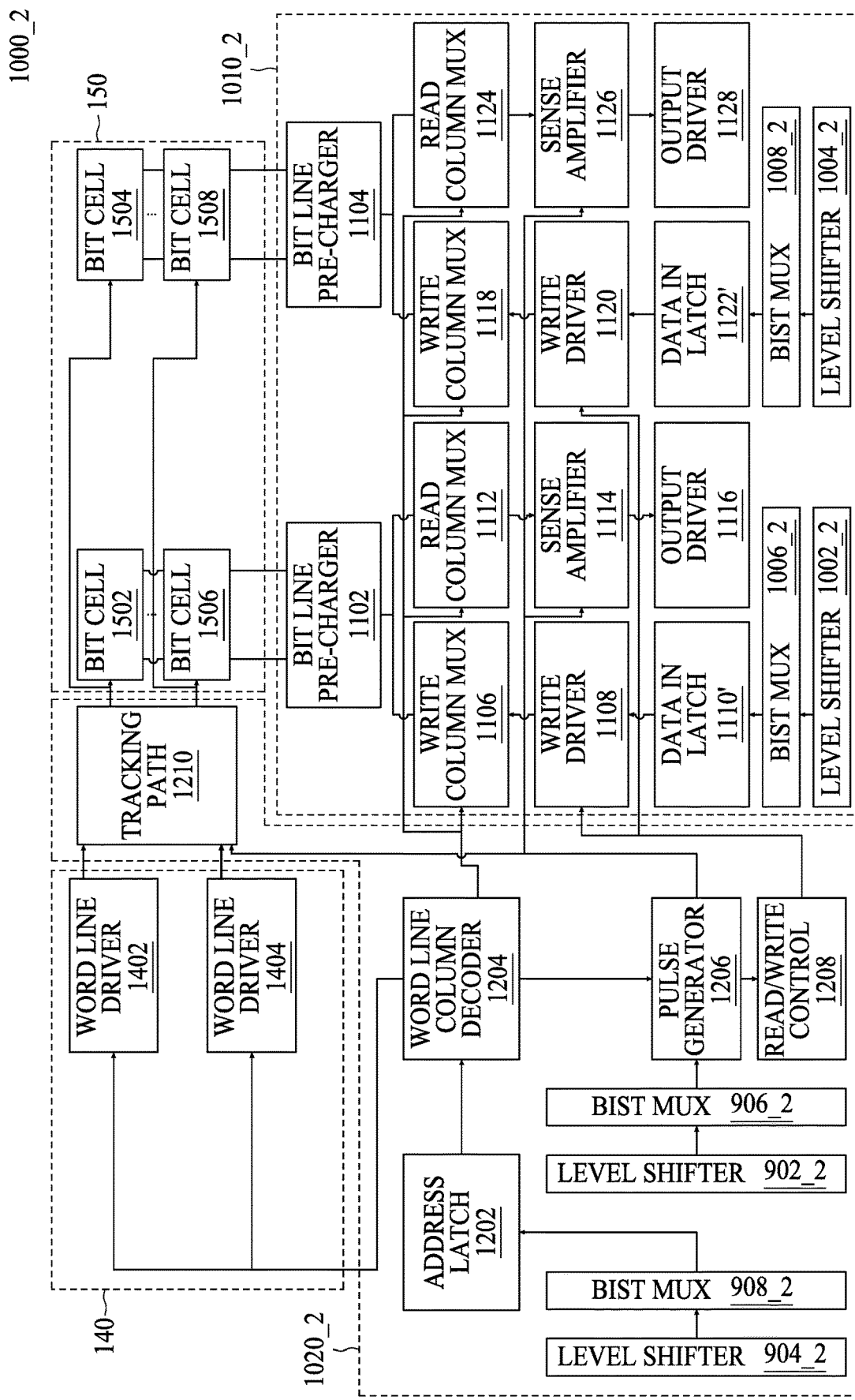
FIG. 11 is a more detailed schematic diagram illustrating a memory macro according to an embodiment of the present disclosure.
Figure 12:
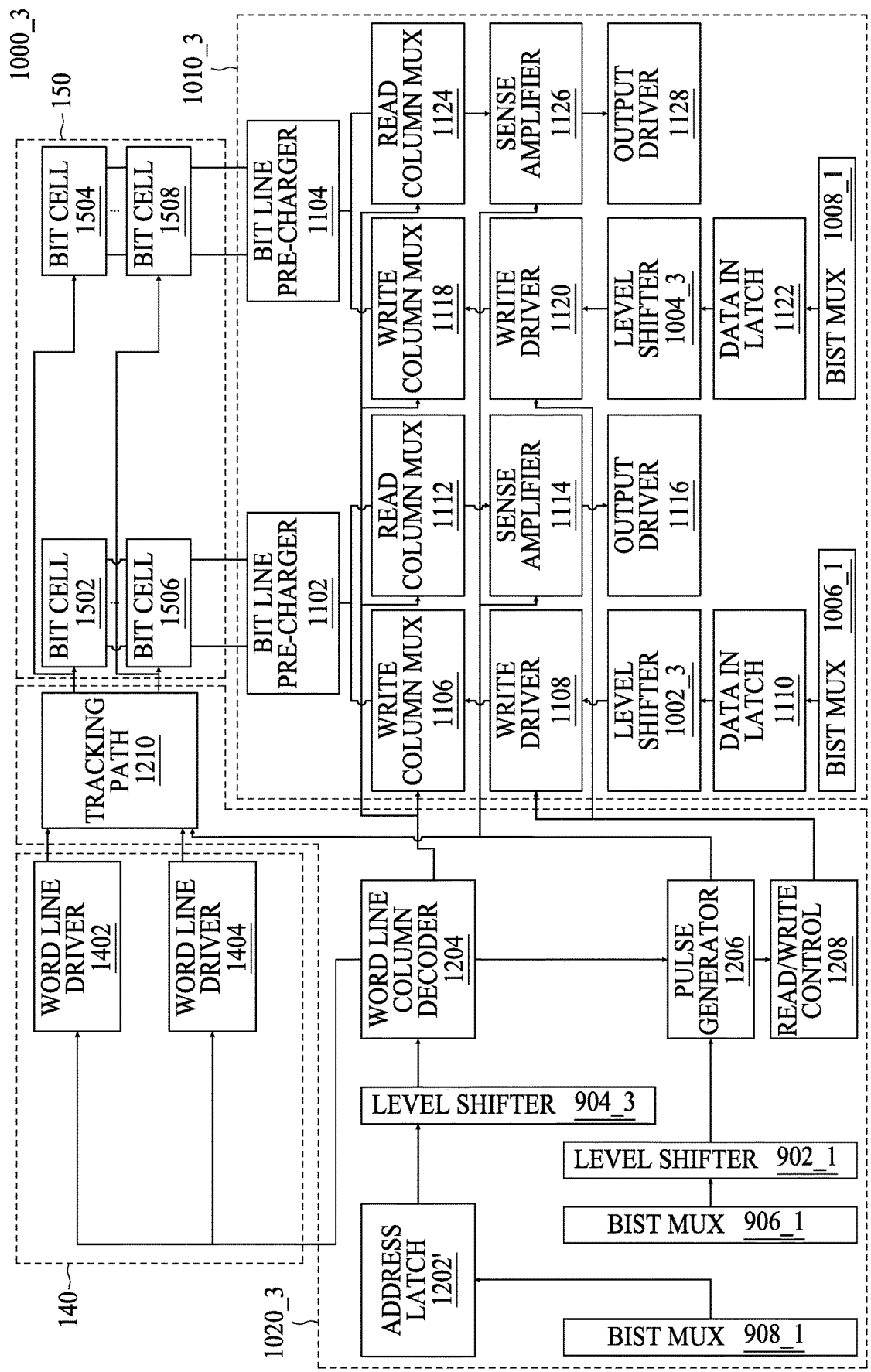
FIG. 12 is a more detailed schematic diagram illustrating a memory macro according to an embodiment of the present disclosure.

FIGS. 10-12 are more detailed schematic diagrams illustrating memory macros 1000_1-1000_3, respectively, according to different embodiments of the present disclosure. In particular, level-shifts between different power domains, e.g. the first voltage VDDM and the second voltage VDD, are depicted in order to enhance understanding. Please note that built-in self-test (BIST) multiplexers shown in each embodiment are for illustrative purpose only and may be omitted. In short, the embodiments may be presented without the BIST multiplexers. The power domain assignations of the first voltage VDDM and the second voltage VDD shown in the embodiments of FIGS. 10-12 are different from each other, and details are described as follows. For ease of understanding, like elements are designated with the same reference numbers throughout the disclosure.

In FIG. 10, a memory macro 1000_1 is disclosed. The memory macro 1000_1 includes the word line driver circuits 140 and the memory array 150, which have been described and illustrated with reference to FIG. 2 in relation to the memory macro 100. As mentioned above, the word line driver circuits 140 and the entire memory array 150 operate at the first voltage VDDM higher than the second voltage VDD in order to reduce occurrence of errors during read/write operations. The memory macro 1000_1 further includes a control circuit 1020_1 and data paths 1010_1. In addition, level-shifters 1002_1, 1004_1 and BIST multiplexers 1006_1, 1008_1 are provided in the data paths 1010_1.

As can be seen at the lower left side of FIG. 10, the control circuit 1020_1 includes the address latch 1202, the word line column decoder 1204, the pulse generator 1206, the read/write control 1208 and the tracking path 1210, which have been described and illustrated with reference to FIG. 2 in relation to the memory macro 100. As previously discussed, the address latch 1202, the word line column decoder 1204, the read/write control 1208 and the pulse generator 1206 operate at the first voltage VDDM. In addition, the tracking path 1210 operates at both the first voltage VDDM and the second voltage VDD. As illustrated in FIG. 10, the the control circuit 1020_1 further includes level shifters 902_1, 904_1 and BIST multiplexers 906_1 and 908_1. The level shifters 902_1 and 904_1 are located at upstream of the address latch 1202 and the pulse generator 1206 for transferring the control inputs from the peripheral voltage, i.e. the second voltage VDD, external to the memory macro 1000_1 to the first voltage VDDM.

In the data paths 1010_1, the level shifters 1002_1 and 1004_1 are located at upstream of the data in latch 1110' and the data in latch 1122', respectively. As such, the data in latch 1110' and the data in latch 1122' are configured to operate at the first voltage VDDM, which is different from the data in latch 1110 and the data in latch 1122 of the memory macro 100. The BIST multiplexers 906_1 and 908_1 are located at upstream of the level shifters 902_1 and 904_1; and the BIST multiplexers 1006_1 and 1008_1 are located at upstream of the level shifters 1002_1 and 1004_1. Therefore, the BIST multiplexers 906_1, 908_1, 1006_1 and 1008_1 operate at the second voltage VDD.

In some embodiments, BIST multiplexers may be placed at downstream of level shifters. An embodiment having such a configuration is shown in FIG. 1L As illustrated in FIG. 1I, a memory macro 1000_2 includes BIST multiplexers 906_2 and 908_2 located at downstream of level shifters 902_2 and 904_2, respectively; and BIST multiplexers 1006_2 and 1008_2 located at downstream of the level shifters 1002_2 and 1004_2, respectively. In this embodiment, the BIST multiplexers 906_2, 908_2, 1006_2 and 1008_2 operate at the first voltage VDDM.

In some embodiments, level shifters may be alternatively placed after data or address latches to further reduce power consumption. An embodiment having such a configuration is shown in FIG. 12. As illustrated in FIG. 12, a memory macro 1000_3 includes a level shifter 904_3 located between an address latch 1202' and the word line column decoder 1204. Compared with the address latch 1202 operating at the first voltage VDDM, the address latch 1202' is configured to operate at the second voltage VDD, and therefore power consumption of the address latch 1202' may be further reduced. In addition, the memory macro 1000_3 further includes a level shifter 1002_3 located after the data in latch 1110 and before the write driver 1108, and a level shifter 1004_3 located after the data in latch 1122 and before the write driver 1120. As such, the data in latch 1110 and the data in latch 1122 are configured to operate at the second voltage VDD, which is different from the data in latch 1110' and the data in latch 1122' of the memory macros 1000_1 and 1000_2.

Some embodiment of the present disclosure provides a dual rail memory operable at a first voltage and a second voltage. The dual rail memory includes: a memory array operates at the first voltage; a word line driver circuit configured to drive a word line of the memory array to the first voltage; a data path configured to transmit an input data signal or an output data signal; wherein the data path includes a first level shifter for transferring the input data signal from the second voltage to the first voltage; and a control circuit configured to provide control signals to the memory array; the word line driver circuit and the data path, wherein the control circuit includes a second level shifter for transferring an input control signal from the second voltage to the first voltage; wherein the data path and the control circuit are configured to operate at both the first and second voltages, and the first voltage is higher than the second voltage.

Some embodiment of the present disclosure provides a memory macro. The memory macro includes: a plurality of memory arrays configured to operate at a first voltage; a read path configured to operate at a second voltage; a write path configured to operate at both the first and second voltages, wherein the write path includes a first level shifter for converting a power domain from the second voltage to the first voltage; a word line driver circuit configured to drive a plurality of word lines of the memory arrays to the first voltage; and a control circuit configured to provide control signals to the memory arrays, the read path, the write path and the word line driver circuit, wherein the control circuit includes a second level shifter for converting a power domain from the second voltage to the first voltage; wherein the read path is configured to operate at the second voltage, the write path and the control circuit are configured to operate at both the first and second voltages.

Some embodiment of the present disclosure provides a hybrid power supply method for configuring a dual rail memory to operate at a first voltage and a second voltage, wherein a memory array of the dual rail memory is operable at the first voltage. The method includes: driving a word line of the memory array to the first voltage; transmitting an input data signal or an output data signal by transferring the input data signal from the second voltage to the first voltage; and providing control signals to the memory array by transferring an input control signal from the second voltage to the first voltage.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A dual rail memory operable at a first voltage and a second voltage, the dual rail memory comprising:
    a memory array that operates at the first voltage;
    a word line driver circuit configured to drive a word line of the memory array to the first voltage; and
    a data path configured to transmit an input data signal or an output data signal, wherein the data path includes:
        a bit line pre-charger;
        a read circuit for transmitting the output data signal;
        a write circuit for transmitting the input data signal;
        a first level shifter for transferring the input data signal from a second voltage domain to a first voltage domain;
        a first built-in self-test (BIST) multiplexer coupled between the first level shifter and the write circuit; and
    a control circuit configured to provide control signals to the memory array, the word line driver circuit and the data path, wherein the control circuit includes a second level shifter for transferring an input control signal from the second voltage domain to the first voltage domain, wherein the control circuit further includes a second BIST multiplexer and an address latch, and the second BIST multiplexer is coupled between the second level shifter and the address latch;
    wherein the data path is configured to operate at both the first and second voltages, the first BIST multiplexer is configured to operate at the first voltage, and the first voltage is higher than the second voltage.

2. The dual rail memory of claim 1, wherein the write circuit includes a data in latch, a write driver and a write column mux, and the data in latch is for latching the input data signal.

3. The dual rail memory of claim 2, wherein the data in latch is coupled between the first BIST multiplexer and the write driver.

4. The dual rail memory of claim 2, wherein the first BIST multiplexer is between the first level shifter and the data in latch.

5. The dual rail memory of claim 2, wherein the write driver is configured to drive the latched input data, wherein a pre-stage of the write driver is configured to operate at the first voltage, and a post-stage of the write driver is configured to operate at the second voltage, and an input terminal of the post-stage of the write driver is electrically coupled to an output terminal of the pre-stage of the write driver.

6. The dual rail memory of claim 1, wherein the bit line pre-charger pre-charges a bit line and a complementary bit line corresponding to a bit cell of the memory array to the second voltage.

7. The dual rail memory of claim 6, wherein the sense amplifier and the output driver are configured to operate at the second voltage.

8. The dual rail memory of claim 1, wherein the read circuit includes a read column mux, a sense amplifier and an output driver.

9. A memory device, comprising:
    a plurality of memory arrays configured to operate at a first voltage;
    a read path configured to operate at a second voltage;
    a write path configured to operate at both the first and second voltages, wherein the write path includes:
        a first level shifter for converting a power domain from a second voltage domain to a first voltage domain;
    a word line driver circuit configured to drive a plurality of word lines of the memory arrays to the first voltage; and
    a control circuit configured to provide control signals to the memory arrays, the read path, the write path and the word line driver circuit, wherein the control circuit includes a first BIST multiplexer, a pulse generator and a second level shifter between the first BIST multiplexer and the pulse generator, and the second level shifter is for converting a power domain from the second voltage domain to the first voltage domain;
    wherein the read path is configured to operate at the second voltage, and the write path and the control circuit are configured to operate at both the first and second voltages.

10. The memory device of claim 9, wherein the write path further includes:
    a data in latch; and
    a write driver, configured to drive an input data latched by the data in latch, the write driver including a pre-stage and a post-stage, the pre-stage of the write driver being configured to operate at the first voltage, and the post-stage of the write driver being configured to operate at the second voltage, and an input terminal of the post-stage of the write driver is electrically coupled to an output terminal of the pre-stage of the write driver.

11. The memory device of claim 9, wherein the control circuit further includes a word line column decoder.

12. The memory device of claim 11, wherein the control circuit further includes an address latch.

13. The memory device of claim 12, wherein the control circuit further includes a read/write control and a tracking path.

14. The memory device of claim 13, wherein the address latch, the word line column decoder, the pulse generator and the read/write control are configured to operate at the first voltage.

15. The memory device of claim 13, wherein the address latch is configured to operate at the second voltage, and the word line column decoder, the pulse generator and the read/write control are configured to operate at the first voltage, and the second level shifter is between the address latch and the word line column decoder.

16. A memory device, comprising:
- a plurality of memory arrays configured to operate at a first voltage;
- a read path configured to operate at a second voltage;
- a write path configured to operate at both the first and second voltages, wherein the write path includes:
- a first level shifter for converting a power domain from a second voltage domain to a first voltage domain;
- a word line driver circuit configured to drive a plurality of word lines of the memory arrays to the first voltage; and
- a control circuit configured to provide control signals to the memory arrays, the read path, the write path and the word line driver circuit, wherein the control circuit includes a pulse generator, a second level shifter and a first BIST multiplexer between second level shifter and the pulse generator, and the second level shifter is for converting a power domain from the second voltage domain to the first voltage domain;
- wherein the read path is configured to operate at the second voltage, and the write path and the control circuit are configured to operate at both the first and second voltages.

17. The memory device of claim 16, wherein the control circuit further includes a word line column decoder.

18. The memory device of claim 17, wherein the control circuit further includes an address latch, a read/write control and a tracking path.

19. The memory device of claim 16, wherein the write path further includes:
- a data in latch; and
- a write driver, configured to drive an input data latched by the data in latch.

20. The memory device of claim 19, wherein the write driver includes a pre-stage and a post-stage, the pre-stage of the write driver being configured to operate at the first voltage, and the post-stage of the write driver being configured to operate at the second voltage.

* * * * *